United States Patent
King et al.

(10) Patent No.: US 10,177,657 B2
(45) Date of Patent: Jan. 8, 2019

(54) RECONFIGURABLE SWITCHED MODE CONVERTER

(71) Applicant: Cirrus Logic International Semiconductor Ltd., Edinburgh (GB)

(72) Inventors: Eric J. King, Dripping Springs, TX (US); Siddharth Maru, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 12 days.

(21) Appl. No.: 15/130,453

(22) Filed: Apr. 15, 2016

(65) Prior Publication Data

US 2016/0308445 A1 Oct. 20, 2016

Related U.S. Application Data

(60) Provisional application No. 62/148,567, filed on Apr. 16, 2015.

(51) Int. Cl.
*H02M 3/158* (2006.01)
*H02M 1/42* (2007.01)
(Continued)

(52) U.S. Cl.
CPC ............. *H02M 3/158* (2013.01); *H02M 1/42* (2013.01); *H02M 1/44* (2013.01); *H03F 1/0227* (2013.01); *H02M 2003/1566* (2013.01)

(58) Field of Classification Search
CPC .................................................. H02M 3/158
See application file for complete search history.

(56) References Cited

U.S. PATENT DOCUMENTS 8,773,196 B2 7/2014 Delano
2011/0260793 A1 10/2011 Jiang et al.
(Continued)

FOREIGN PATENT DOCUMENTS

WO 2012055968 A1 5/2012

OTHER PUBLICATIONS

International Search Report and Written Opinion of the International Searching Authority, International Application No. PCT/EP2016/058470, dated Sep. 19, 2016.

*Primary Examiner* — Jue Zhang
*Assistant Examiner* — Trinh Q Dang
(74) *Attorney, Agent, or Firm* — Jackson Walker L.L.P.

(57) ABSTRACT

A switching power stage for producing an output voltage to a load may include a configurable switched mode power converter and a controller. The power converter may include a power inductor, a plurality of switches arranged to sequentially operate in a plurality of switch configurations, and an output for producing the output voltage, the output comprising a first output terminal and a second output terminal. The controller may be configured to, for at least one range of magnitudes of the output voltage, control the plurality of switches to operate in at least three switching phases per switching cycle of the power converter in order to generate the output voltage, wherein switching cycles of the power converter are substantially approximately equal in period and control the plurality of switches to apply for each of the at least three switching phases a respective switch configuration of the plurality of switch configurations.

36 Claims, 8 Drawing Sheets

(51) Int. Cl.
*H02M 1/44* (2007.01)
*H03F 1/02* (2006.01)
*H02M 3/156* (2006.01)

(56) References Cited

U.S. PATENT DOCUMENTS

2012/0026771 A1* 2/2012 Imura .................. B60L 3/0015
363/178
2012/0319669 A1 12/2012 Chen et al.
2014/0369090 A1* 12/2014 Ueki ...................... H02M 1/15
363/41
2015/0288209 A1* 10/2015 Rippel .................. H02J 7/0065
320/107

* cited by examiner

| CONFIGURATION | SWITCH STATES | | | | | |
|---|---|---|---|---|---|---|
| | 51 | 52 | 53 | 54 | 55 | 56 |
| CONFIG1$^+$ | 1 | 0 | 1 | 0 | 0 | 0 |
| CONFIG2$^+$ | 1 | 0 | 0 | 0 | 1 | 0 |
| CONFIG3$^+$ | 0 | 0 | 0 | 1 | 1 | 0 |
| CONFIG4 | 0 | 0 | 0 | 0 | 1 | 1 |
| CONFIG1$^-$ | 0 | 1 | 0 | 1 | 0 | 0 |
| CONFIG2$^-$ | 0 | 1 | 0 | 0 | 0 | 1 |
| CONFIG3$^-$ | 0 | 0 | 1 | 1 | 0 | 0 |

FIG. 6A

| $V_{OUT}$ | $|V_{OUT}| < V_{SUPPLY}$? | SWITCH STATES | | |
|---|---|---|---|---|
| +/- | Y/N | 57 | 58 | 59 |
| + | Y | 0 | 0 | 1 |
| + | N | 1 | 0 | 0 |
| - | Y | 0 | 0 | 1 |
| - | N | 0 | 1 | 0 |

FIG. 6B

| $V_{OUT}$(+/-) | $V_{CM}$(↑/↓) | PHASE | CONFIGURATION |
|---|---|---|---|
| + | N/A | T1 | CONFIG1$^+$ |
| + | ↑ | T2 | CONFIG2$^+$ |
| + | ↓ | T2 | CONFIG3$^-$ |
| + | N/A | T3 | CONFIG4 |
| - | N/A | T1 | CONFIG1$^-$ |
| - | ↑ | T2 | CONFIG2$^-$ |
| - | ↓ | T2 | CONFIG3$^+$ |
| - | N/A | T3 | CONFIG4 |

| $V_{OUT}$(+/-) | PHASE | CONFIGURATION |
|---|---|---|
| + | T1 | CONFIG1$^+$ |
| + | T2 | CONFIG2$^+$ |
| + | T3 | CONFIG3$^+$ |
| - | T1 | CONFIG1$^-$ |
| - | T2 | CONFIG2$^-$ |
| - | T3 | CONFIG3$^-$ |

RECONFIGURABLE SWITCHED MODE CONVERTER

RELATED APPLICATIONS

The present disclosure claims priority to U.S. Provisional Patent Application Ser. No. 62/148,567, filed Apr. 16, 2015, which is incorporated by reference herein in its entirety.

FIELD OF DISCLOSURE

The present disclosure relates in general to circuits for audio devices, including without limitation personal audio devices such as wireless telephones and media players, and more specifically, to a switch mode amplifier including a reconfigurable switched mode converter for driving an audio transducer of an audio device.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a speaker driver including a power amplifier for driving an audio output signal to headphones or speakers.

One existing approach to driving an audio output signal is to employ a speaker driver, such as speaker driver 100 depicted in FIG. 1. Speaker driver 100 may include an envelope-tracking boost converter 102 (e.g., a Class H amplifier) followed by a full-bridge output stage 104 (e.g., a Class D amplifier) which effectively operates as another converter stage. Boost converter 102 may include a power inductor 105, switches 106, 108, and a capacitor 110 arranged as shown. Full-bridge output stage 104 may include switches 112, 114, 116, and 118, inductors 120 and 124, and capacitors 122 and 126 as shown.

Speaker drivers, such as speaker driver 100, suffer from numerous disadvantages. One disadvantage is that due to switching in output stage 104, such a speaker driver 100 may give rise to large amounts of radiated electromagnetic radiation, which may cause interference with other electromagnetic signals. Such radiated electromagnetic interference may be mitigated by LC filters formed using inductor 120 and capacitor 122 and inductor 124 and capacitor 126. However, such LC filters are often quite large in size, and coupling capacitors 122 and 126 to the terminals of the output transducer may have a negative impact on the power efficiency of speaker driver 100.

In addition, such architectures often do not handle large impulsive signals. To reduce power consumption, a power supply voltage $V_{SUPPLY}$ may be varied in accordance with the output signal, such that power supply voltage $V_{SUPPLY}$ may operate at lower voltage levels for lower output signal magnitudes. Thus, if a signal quickly increases, adequate time may not be present to increase voltage $V_{SUPPLY}$, thus leading to signal clipping unless a delay is placed in the signal path. However, adding a delay to a signal path may cause incompatibility with other types of audio circuits, such as adaptive noise cancellation circuits.

SUMMARY

In accordance with the teachings of the present disclosure, one or more disadvantages and problems associated with existing approaches to driving an audio output signal to an audio transducer may be reduced or eliminated.

In accordance with embodiments of the present disclosure, a switching power stage for producing an output voltage to a load may include a configurable switched mode power converter and a controller. The configurable switched mode power converter may include a power inductor, a plurality of switches arranged to sequentially operate in a plurality of switch configurations, and an output for producing the output voltage, the output comprising a first output terminal and a second output terminal. The controller may be configured to, for at least one range of magnitudes of the output voltage, control the plurality of switches to operate in at least three switching phases per switching cycle of the configurable switched mode power converter in order to generate the output voltage, wherein switching cycles of the configurable switched mode power converter are substantially approximately equal in period and control the plurality of switches to apply for each of the at least three switching phases a respective switch configuration of the plurality of switch configurations in order to achieve at least one of: maintenance of a continuous current of the power inductor throughout a dynamic range of the output voltage, maintenance of a continuous peak current of the power inductor throughout a dynamic range of the output voltage, regulation of a common mode voltage of the first output terminal and the second output terminal, minimization of electromagnetic interference of the power converter, and optimization of power efficiency of the power converter.

In accordance with these and other embodiments of the present disclosure, a method for producing an output voltage to a load may include in a configurable switched mode power converter, comprising a power inductor, a plurality of switches arranged to sequentially operate in a plurality of switch configurations, and an output for producing the output voltage, the output comprising a first output terminal and a second output terminal, for at least one range of magnitudes of the output voltage, controlling the plurality of switches to operate in at least three switching phases per switching cycle of the configurable switched mode power converter in order to generate the output voltage, wherein switching cycles of the configurable switched mode power converter are substantially approximately equal in period. The method may also include controlling the plurality of switches to apply for each of the at least three switching phases a respective switch configuration of the plurality of switch configurations in order to achieve at least one of: maintenance of a continuous current of the power inductor throughout a dynamic range of the output voltage, maintenance of a continuous peak current of the power inductor throughout a dynamic range of the output voltage, regulation of a common mode voltage of the first output terminal and the second output terminal, minimization of electromagnetic interference of the power converter, and optimization of power efficiency of the power converter.

In accordance with these and other embodiments of the present disclosure, a switching power stage for producing an output voltage to a load may include a configurable switched mode power converter and a controller. The configurable switched mode power converter may include a power inductor, a first supply terminal coupled to a first supply voltage, a second supply terminal coupled to a second supply voltage, an output for producing the output voltage, the output comprising a first output terminal and a second output terminal, and a plurality of switches including switches for respectively coupling the power inductor to each of the first supply terminal, the second supply terminal, the first output terminal, and the second output terminal, such that the plurality of switches provides at least seven switching configurations of the plurality of switches among of the first supply terminal, the second supply terminal, the first output terminal, and the second output terminal. The controller may be configured to enable at least three switching configurations of the at least seven switching configurations per switching cycle of the configurable switched mode power converter, wherein switching cycles of the configurable switched mode power converter are substantially approximately equal in period.

In accordance with these and other embodiments of the present disclosure, a method for producing an output voltage to a load may include, in a configurable switched mode power converter, comprising a power inductor, a first supply terminal coupled to a first supply voltage, a second supply terminal coupled to a second supply voltage, an output for producing the output voltage, the output comprising a first output terminal and a second output terminal, and a plurality of switches including switches for respectively coupling the power inductor to each of the first supply terminal, the second supply terminal, the first output terminal, and the second output terminal, such that the plurality of switches provides at least seven switching configurations of the plurality of switches among of the first supply terminal, the second supply terminal, the first output terminal, and the second output terminal, enabling at least three switching configurations of the at least seven switching configurations per switching cycle of the configurable switched mode power converter, wherein switching cycles of the configurable switched mode power converter are substantially approximately equal in period.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIGS. 6A and 6B illustrate tables showing various switch configurations that the power converter of FIG. 5 may operate in, in accordance with embodiments of the present disclosure;

DETAILED DESCRIPTION

Figure 1:
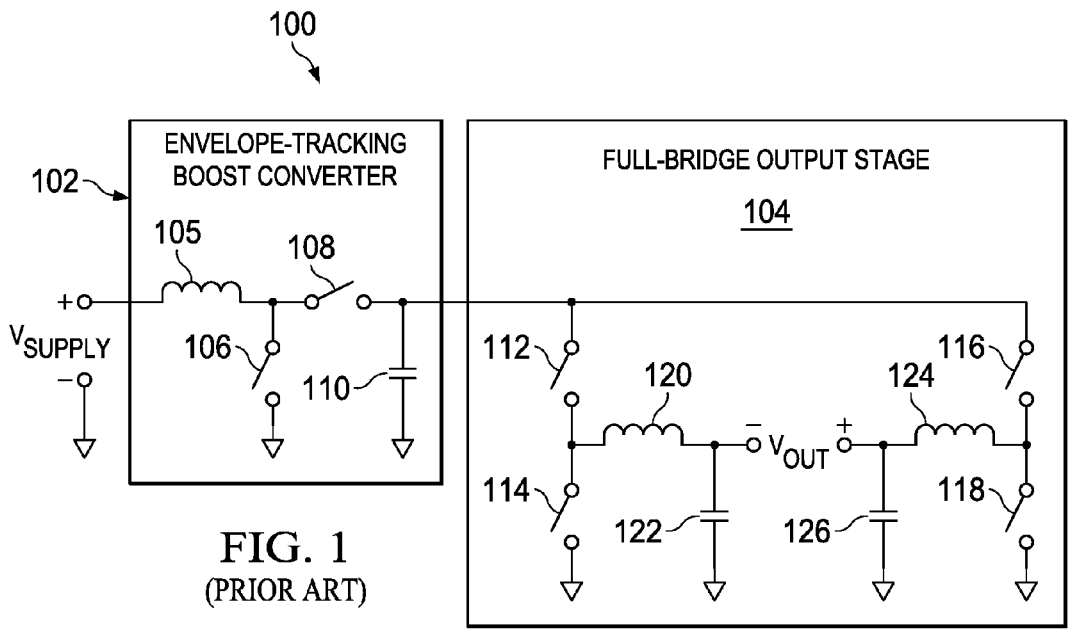
FIG. 1 illustrates an example speaker driver, as is known in the relevant art.
Figure 2:
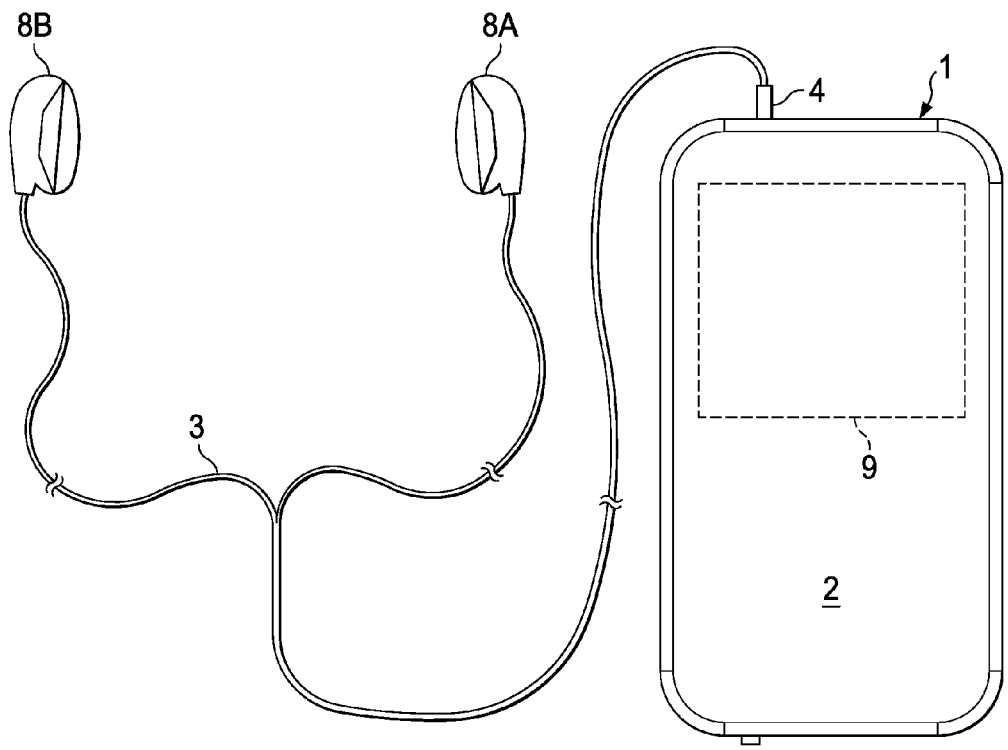
FIG. 2 illustrates an example personal audio device, in accordance with embodiments of the present disclosure.

FIG. 2 illustrates an example personal audio device 1, in accordance with embodiments of the present disclosure. FIG. 2 depicts personal audio device 1 coupled to a headset 3 in the form of a pair of earbud speakers 8A and 8B. Headset 3 depicted in FIG. 2 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 2, personal audio device 1 may include an audio integrated circuit (IC) 9 for generating an analog audio signal for transmission to headset 3 and/or another audio transducer.

Figure 3:
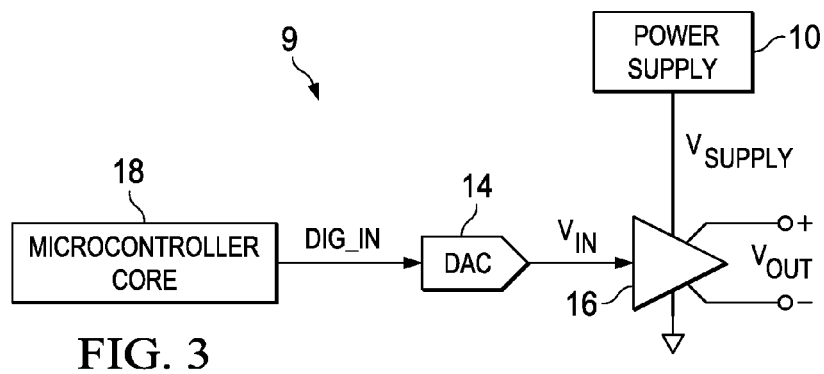
FIG. 3 illustrates a block diagram of selected components of an example audio integrated circuit of a personal audio device, in accordance with embodiments of the present disclosure.

FIG. 3 illustrates a block diagram of selected components of an example audio IC 9 of a personal audio device, in accordance with embodiments of the present disclosure. As shown in FIG. 3, a microcontroller core 18 may supply a digital audio input signal DIG_IN to a digital-to-analog converter (DAC) 14, which may convert the digital audio input signal to an analog signal $V_{IN}$. DAC 14 may supply analog signal $V_{IN}$ to an amplifier 16 which may amplify or attenuate audio input signal $V_{IN}$ to provide a differential audio output signal $V_{OUT}$, which may operate a speaker, a headphone transducer, a line level signal output, and/or other suitable output. In some embodiments, DAC 14 may be an integral component of amplifier 16. A power supply 10 may provide the power supply rail inputs of amplifier 16. In some embodiments, power supply 10 may comprise a battery. Although FIGS. 2 and 3 contemplate that audio IC 9 resides in a personal audio device, systems and methods described herein may also be applied to electrical and electronic systems and devices other than a personal audio device, including audio systems for use in a computing device larger than a personal audio device, an automobile, a building, or other structure.

Figure 4:
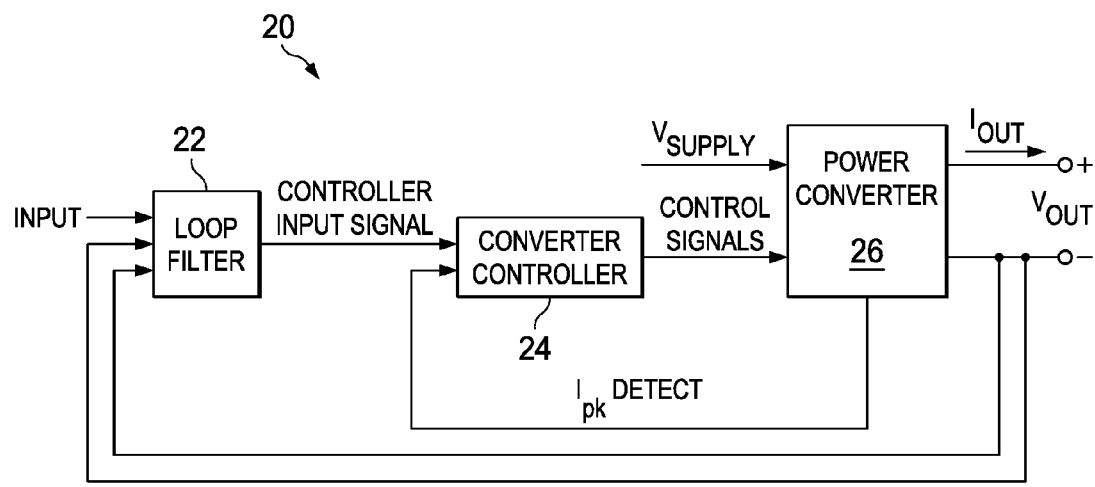
FIG. 4 illustrates a block and circuit diagram of selected components of an example switched mode amplifier, in accordance with embodiments of the present disclosure.

FIG. 4 illustrates a block and circuit diagram of selected components of an example switched mode amplifier 20, in accordance with embodiments of the present disclosure. In some embodiments, switched mode amplifier 20 may implement all or a portion of amplifier 16 described with respect to FIG. 3. As shown in FIG. 4, switched mode amplifier 20 may comprise a loop filter 22, a converter controller 24, and a power converter 26.

Loop filter 22 may comprise any system, device, or apparatus configured to receive an input signal (e.g., audio input signal $V_{IN}$ or a derivative thereof) and a feedback signal (e.g., audio output signal $V_{OUT}$, a derivative thereof, or other signal indicative of audio output signal $V_{OUT}$) and based on such input signal and feedback signal, generate a controller input signal to be communicated to converter controller 24. In some embodiments, such controller input signal may comprise a signal indicative of an integrated error between the input signal and the feedback signal. In other embodiments, such controller input signal may comprise a signal indicative of a target current signal to be driven as an output current $I_{OUT}$ or a target voltage signal to be driven as an output voltage $V_{OUT}$ to a load coupled to the output terminals of power converter 26.

Converter controller 24 may comprise any system, device, or apparatus configured to, based on the controller input signal, sequentially select among a plurality of switch configurations of power converter 26 and based on an input signal (e.g., input signal INPUT), output signal $V_{OUT}$, detection of a peak current $I_{pk}$ of a power inductor of power converter 26, and/or other characteristics of switched mode amplifier 20, communicate a plurality of control signals to power converter 26 to apply a switch configuration from a plurality of switch configurations of switches of power converter 26 to selectively activate or deactivate each of the plurality of switches in order to transfer electrical energy from a power supply $V_{SUPPLY}$ to the load of switched-mode amplifier 20 in accordance with the input signal. Examples of switch configurations associated with each are described in greater detail elsewhere in this disclosure. In addition, in some embodiments, converter controller 24 may control switches of a power converter 26 in order to regulate a common mode voltage $V_{CM}$ of the output terminals of power converter 26, as described in greater detail below.

Power converter 26 may receive at its input a voltage $V_{SUPPLY}$ (e.g., provided by power supply 10) at its input, and may generate at its output audio output signal $V_{OUT}$. Although not explicitly shown in FIG. 3, in some embodiments, voltage $V_{SUPPLY}$ may be received via input terminals including a positive input terminal and a negative input terminal which may be coupled to a ground voltage. As described in greater detail in this disclosure, power converter 26 may comprise a power inductor and a plurality of switches that are controlled by control signals received from converter controller 24 in order to convert voltage $V_{SUPPLY}$ to audio output signal $V_{OUT}$, such that audio output signal $V_{OUT}$ is a function of the input signal to loop filter 22. Examples of power converter 26 are described in greater detail elsewhere in this disclosure.

Figure 5:
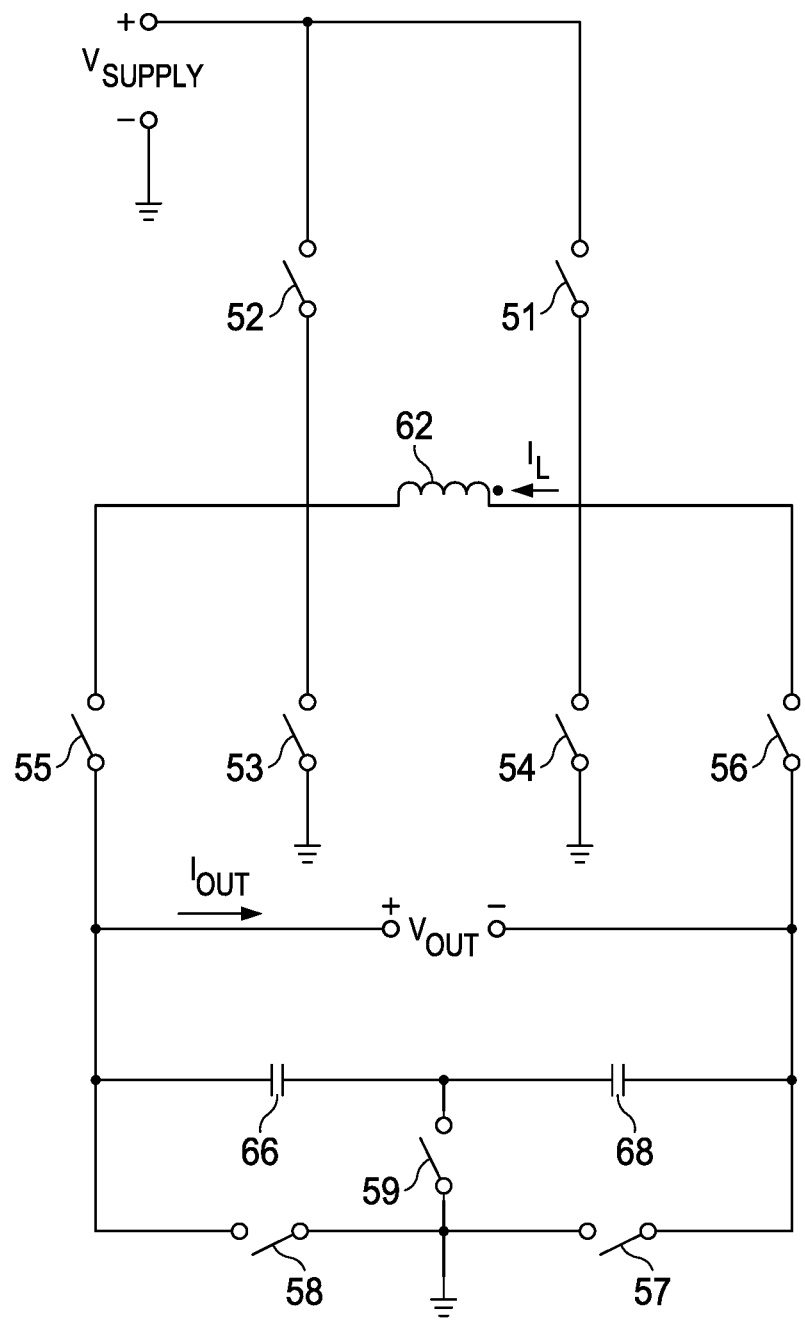
FIG. 5 illustrates a circuit diagram of selected components of another example power converter, in accordance with embodiments of the present disclosure.

FIG. 5 illustrates a circuit diagram of selected components of an example power converter 26, in accordance with embodiments of the present disclosure. In some embodiments, power converter 26 depicted in FIG. 5 may implement all or a portion of power converter 26 described with respect to FIG. 4. As shown in FIG. 5, power converter 26 may receive at its input a voltage $V_{SUPPLY}$ (e.g., provided by power supply 10) at input terminals, including a positive input terminal and a negative input terminal which may be coupled to a ground voltage, and may generate at its output a differential output voltage $V_{OUT}$. Power converter 26 may comprise a power inductor 62 and plurality of switches 51-59. Power inductor 62 may comprise any passive two-terminal electrical component which resists changes in electrical current passing through it and such that when electrical current flowing through it changes, a time-varying magnetic field induces a voltage in power inductor 62, in accordance with Faraday's law of electromagnetic induction, which opposes the change in current that created the magnetic field.

Each switch 51-59 may comprise any suitable device, system, or apparatus for making a connection in an electric circuit when the switch is enabled (e.g., activated, closed, or on) and breaking the connection when the switch is disabled (e.g., deactivated, open, or off) in response to a control signal received by the switch. For purposes of clarity and exposition, control signals for switches 51-59 (e.g., control signals communicated from converter controller 24) are not depicted although such control signals would be present to selectively enable and disable switches 51-59. In some embodiments, a switch 51-59 may comprise an n-type metal-oxide-semiconductor field-effect transistor. Switch 51 may be coupled between a positive input terminal of the supply voltage $V_{SUPPLY}$ and a first terminal of power inductor 62. Switch 52 may be coupled between the positive input terminal and a second terminal of power inductor 62. Switch 53 may be coupled between a negative input terminal of the supply voltage $V_{SUPPLY}$ (e.g., ground voltage) and the second terminal of power inductor 62. Switch 54 may be coupled between the negative input terminal (e.g., ground voltage) and the first terminal of power inductor 62. Switch 55 may be coupled between a positive output terminal of power converter 26 and the second terminal of power inductor 62. Switch 56 may be coupled between a negative output terminal of power converter 26 and the first terminal of power inductor 62. Switch 57 may be coupled between the negative output terminal of power converter 26 and the second input terminal (e.g., ground voltage). Switch 58 may be coupled between the positive output terminal of power converter 26 and the second input terminal (e.g., ground voltage). Switch 59 may be coupled between a common capacitor node and the second input terminal (e.g., ground voltage).

In addition to switches 51-59 and power inductor 62, power converter 26 may include a first output capacitor 66 coupled between the positive terminal of the output terminal of power converter 26 and the common capacitor node and a second output capacitor 68 coupled between the negative terminal of the output terminal of power converter 26 and the common capacitor node. Each output capacitor 66 and 68 may comprise a passive two-terminal electrical component used to store energy electrostatically in an electric field, and may generate a current in response to a time-varying voltage across the capacitor.

As described above, a power converter 26 may operate in a plurality of different switch configurations. FIGS. 6A and 6B illustrate tables showing various switch configurations that power converter 26 may operate in.

FIG. 6A depicts seven different switch configurations that converter controller 24 may select of switches 51-56, in accordance with embodiments of the present disclosure. For example, in a configuration CONFIG1+, converter controller 24 may enable switches 51 and 53 and disable switches 52, 54, 55, and 56, thus creating an electrical path from the positive terminal of the power supply, through power inductor 62, to the negative terminal (e.g., ground voltage) of the power supply in order to charge power inductor 62. As another example, in a configuration CONFIG2+, converter controller 24 may enable switches 51 and 55 and disable switches 52, 53, 54, and 56, thus creating an electrical path from the positive terminal of the power supply, through power inductor 62, to a first output terminal of power converter 26 in order to transfer energy stored in power inductor 62 to a load of power converter 26. Further, in a configuration CONFIG3+, converter controller 24 may enable switches 54 and 55 and disable switches 51, 52, 53, and 56, thus creating an electrical path from a second output terminal of power converter 26, through power inductor 62, to the negative terminal of the power supply (e.g., ground voltage) in order to either discharge charge from the second output terminal to the negative terminal of the power supply or transfer energy stored in power inductor 62 to the second output terminal. In addition, in a configuration CONFIG4, controller 24 may enable switches 55 and 56 and disable switches 51, 52, 53, and 54, thus creating an electrical path from the first output terminal of power converter 26, through power inductor 62, to a second output terminal of power converter 26 in order to redistribute charge between the output terminals of power converter 26 in a differential output mode, or to discharge one of the output terminals to the negative terminal of the power supply in a single-ended mode, as described in greater detail below.

In a configuration CONFIG1−, converter controller 24 may enable switches 52 and 54 and disable switches 51, 53, 55, and 56, thus creating an electrical path from the positive terminal of the power supply, through power inductor 62, to the negative terminal (e.g., ground voltage) of the power supply in order to charge power inductor 62 in a polarity opposite to that of configuration CONFIG1+. In a configuration CONFIG2−, converter controller 24 may enable switches 52 and 56 and disable switches 51, 53, 54, and 55, thus creating an electrical path from the positive terminal of the power supply, through power inductor 62, to the second terminal of the output of power converter 26 in order to transfer energy stored in power inductor 62 to a load of power converter 26. In a configuration CONFIG3−, converter controller 24 may enable switches 53 and 54 and disable switches 51, 52, 55, and 56, thus creating an electrical path from the first output terminal of power converter 26, through power inductor 62, to the negative terminal of the power supply (e.g., ground voltage) in order to either discharge charge from the first output terminal to the negative terminal of the power supply or transfer energy stored in power inductor 62 to the first output terminal.

Figure 7A:
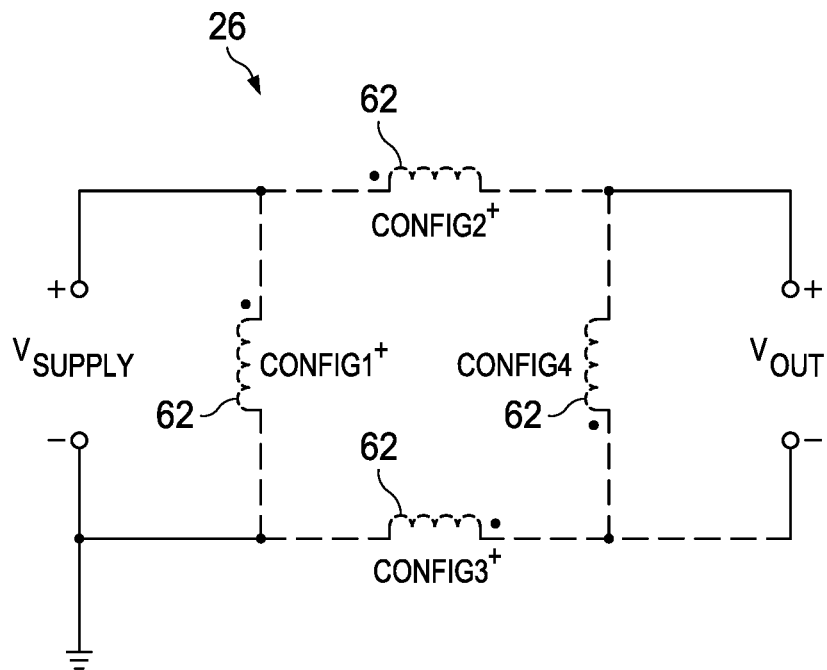
FIGS. 7A and 7B illustrate equivalent circuit diagrams of selected components of the power converter of FIG. 5 operating in various phases of a switching cycle of the power converter, in accordance with embodiments of the present disclosure.
Figure 7B:
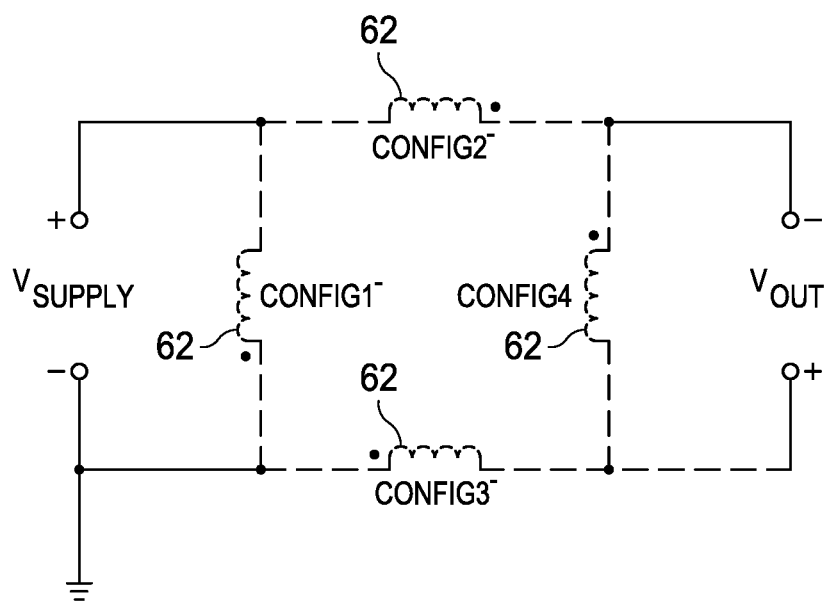

In some embodiments, power converter 26 may comprise one or more additional switches which permit configurations similar to those above, but with the polarity of power inductor 26 reversed. I FIGS. 7A and 7B illustrate equivalent circuit diagrams of selected components of power converter 26 operating in various phases of power converter 26 depicted in FIG. 6A, in accordance with embodiments of the present disclosure.

FIG. 6B depicts three different switch configurations that converter controller 24 may select of switches 57, 58, and 59, based on polarity of output voltage $V_{OUT}$ and the magnitude of $V_{OUT}$ relative to $V_{SUPPLY}$. When the magnitude of output voltage $V_{OUT}$ is lesser than supply voltage $V_{SUPPLY}$, converter controller 24 may enable switch 59 and disable switches 57 and 58, which may have the effect of making output voltage $V_{OUT}$ a differential voltage (e.g., with neither output terminal of the output of power converter 26 coupled to the second terminal of the power supply). When the magnitude of output voltage $V_{OUT}$ is greater than or equal to the supply voltage $V_{SUPPLY}$ and output voltage $V_{OUT}$ is positive, converter controller 24 may enable switch 57 and disable switches 58 and 59, which may have the effect of making output voltage $V_{OUT}$ a single-ended voltage equal to the potential on the first output terminal of power converter 26. When the magnitude of output voltage $V_{OUT}$ is greater than or equal to the supply voltage $V_{SUPPLY}$ and output voltage $V_{OUT}$ is negative, converter controller 24 may enable switch 58 and disable switches 57 and 59, which may have the effect of making output voltage $V_{OUT}$ a single-ended voltage equal to the potential on the second output terminal of power converter 26.

In operation, converter controller 24 may control switches 51-59 of power converter 26 in order to generate output voltage $V_{OUT}$ based on an input signal (e.g., INPUT). For example, the number of phases in a switching cycle of power converter 26 and the switching configuration applied for each of such phases may be based on the desired output voltage $V_{OUT}$ and in some cases, whether a common mode $V_{CM}$ voltage of the output terminals of power converter 26 is to be increased or decreased in order to regulate common mode voltage $V_{CM}$.

To illustrate, converter controller 24 may control switches 51-59 of power converter 26 to operate in two phases per switching cycle in a first output voltage range when $0 \leq |V_{OUT}| < V_1$, wherein $V_1$ is a predetermined threshold voltage greater or equal to zero and less than supply voltage $V_{SUPPLY}$. For example, in a first phase T1 of operation in the first output voltage range, converter controller 24 may apply configuration CONFIG1+ (or configuration CONFIG1−) and apply configuration CONFIG4 in a second phase T2 of operation in the first output voltage range (e.g., operating in a two-phase buck mode of operation). In addition, converter controller 24 may control switches 51-59 of power converter 26 to operate in three phases per switching cycle in a second output voltage range when $V_1 \leq |V_{OUT}| < V_2$, wherein $V_2$ is a predetermined threshold voltage greater than supply voltage $V_{SUPPLY}$. In other words, for each switching cycle of power converter 26, power converter 26 may operate in three phases during the switching cycle, and power converter 26 maintains a different switch configuration for each of the three phases. In embodiments of the present disclosure, switching cycles of power converter 26 may substantially be approximately equal in period (e.g., within manufacturing and operational tolerances that may cause generally insignificant differences in periodicity of switching cycles desired to be equal in period).

The second output voltage range (e.g., $V_1 \leq |V_{OUT}| < V_2$) may further be subdivided into a first triphase subrange A wherein $V_1 \leq |V_{OUT}| < V_{SUPPLY}$ and a second triphase subrange B wherein $V_{SUPPLY} \leq |V_{OUT}| < V_2$. In first triphase subrange A, power converter 26 may operate in a differential output mode (e.g., switch 59 is enabled and switches 57 and 58 are disabled such that neither output terminal is coupled to the negative input terminal of the power supply). In second triphase subrange B, power converter 26 may operate in a single-ended output mode (e.g., switch 59 is disabled and either of switch 57 or switch 58 is disabled based on the polarity of output voltage $V_{OUT}$ as shown in FIG. 6B such that one of the output terminals is coupled to the negative input terminal of the power supply).

In each of the sub-ranges of the second output voltage range, converter controller 24 may control switches 51-59 of power converter 26 to select any suitable order of switching configurations depending on a desired characteristic for power converter 26 (e.g., regulation of common mode voltage $V_{CM}$ of output terminals, optimization of power efficiency, minimization of electromagnetic interference, etc.). For example, FIG. 8 illustrates a table depicting example phases and switching configurations associated with each phase for operation in first triphase subrange A and FIG. 9 illustrates a table depicting example phases and switching configurations associated with each phase for operation in second triphase subrange B, in accordance with embodiments of the present disclosure.

Figures 8, 9, 10:
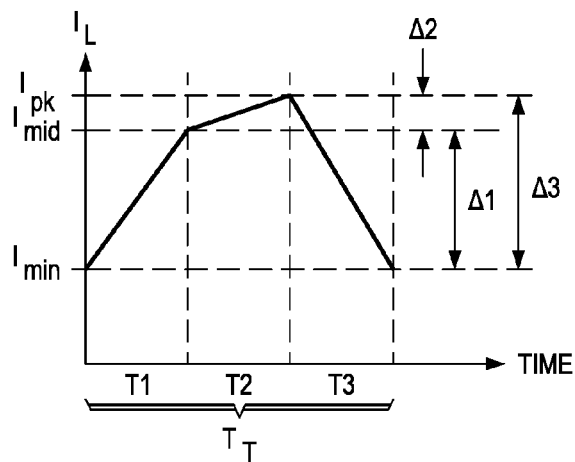
FIG. 8 illustrates a table showing switch configurations that may be applied for each phases of operation of the power converter of FIG. 5 in tri-phase operation in a differential output mode, in accordance with embodiments of the present disclosure.
FIG. 9 illustrates a table showing switch configurations that may be applied for each phases of operation of the power converter of FIG. 5 in tri-phase operation in a single-ended output mode, in accordance with embodiments of the present disclosure.
FIG. 10 illustrates graphs depicting example waveforms of inductor current versus time for switching cycles of the power converter of FIG. 5, in accordance with embodiments of the present disclosure.

As shown in FIG. 8, in first triphase subrange A, converter controller 24 may control switches 51-59 of power converter 26 to operate in phases T1, T2, and T3 in each switching cycle of power converter 26. When output voltage $V_{OUT}$ is positive, converter controller 24 may apply configuration CONFIG1$^+$ in phase T1, apply configuration CONFIG2$^+$ in phase T2 if common mode voltage $V_{CM}$ needs to be increased to regulate common mode voltage $V_{CM}$ to a desired common-mode voltage (e.g., $V_{SUPPLY}/2$), apply configuration CONFIG3$^-$ in phase T2 if common mode voltage $V_{CM}$ needs to be decreased to regulate common mode voltage $V_{CM}$ to the desired common-mode voltage, and apply configuration CONFIG4 in phase T3. Similarly, when output voltage $V_{OUT}$ is negative, converter controller 24 may apply configuration CONFIG1$^-$ in phase T1, apply configuration CONFIG2$^-$ in phase T2 if common mode voltage $V_{CM}$ needs to be increased to regulate common mode voltage $V_{CM}$ to a desired common-mode voltage (e.g., $V_{SUPPLY}/2$), apply configuration CONFIG3$^+$ in phase T2 if common mode voltage $V_{CM}$ needs to be decreased to regulate common mode voltage $V_{CM}$ to the desired common-mode voltage, and apply configuration CONFIG4 in phase T3.

As shown in FIG. 9, converter controller 24 may control switches 51-59 of power converter 26 to operate in phases T1, T2, and T3 in each switching cycle of power converter 26. When output voltage $V_{OUT}$ is positive, converter controller 24 may apply configuration CONFIG1$^+$ in phase T1, apply configuration CONFIG2$^+$ in phase T2, and apply configuration CONFIG3$^+$ in phase T3. Similarly, when output voltage $V_{OUT}$ is negative, converter controller 24 may apply configuration CONFIG1$^-$ in phase T1, apply configuration CONFIG2$^-$ in phase T2, and apply configuration CONFIG3$^-$ in phase T3.

Accordingly, when operating in the second output voltage range (e.g., $V_1 \leq |V_{OUT}| < V_2$), converter controller 24 may control switches 51-59 of power converter 26 in phases T1, T2, and T3 in each switching cycle of power converter 26 such that: (i) during phase T1, power inductor 62 is charged from the positive input terminal to the negative input terminal; (ii) during phase T2, power inductor 62 is coupled between a supply terminal and one of the output terminals; and (iii) during phase T3, power inductor 62 is either coupled between one of the output terminals and the negative supply terminal (single-ended mode) or between the two output terminals (differential mode).

Further, converter controller 24 may control switches 51-59 of power converter 26 to operate in two phases per switching cycle in a third output voltage range when $|V_{OUT}| > V_2$. For example, in a first phase T1 of operation in the third output voltage range, converter controller 24 may apply configuration CONFIG1$^+$ (or configuration CONFIG1$^-$) and apply configuration CONFIG2$^+$ (or configuration CONFIG2$^-$) in a second phase T2 of operation in the third output voltage range (e.g., operating in a two-phase boost mode of operation).

Although the foregoing contemplates operation in three ranges of output voltage $V_{OUT}$, in some embodiments, operation may take place in fewer than three ranges of operation. For example, in some embodiments, threshold voltage $V_1$ may equal 0, in which case the first output voltage range does not exist and converter controller 24 and power converter 26 do not operate in a two-phase switching in such a first output voltage range. In these and other embodiments, threshold voltage $V_2$ may equal the maximum full scale voltage of output voltage $V_{OUT}$, in which case the third output voltage range does not exist and converter controller 24 and power converter 26 do not operate in a two-phase switching in such a third output voltage range.

In tri-phase operation in the second output voltage range (e.g., $V_1 \leq |V_{OUT}| < V_2$), assuming operation in a continuous conduction mode for power inductor 62, the following volt-second equation must hold true in each switching cycle:

$$V_{SUPPLY}T_1((V_{SUPPLY}-V_{OUT})/K)T_2+V_{OUT}T_3=0$$

Where $T_1$, $T_2$, and $T_3$ are the durations of periods T1, T2, and T3, respectively, and K is a constant having a value of 2 when the output of power converter 26 is differential (e.g., switches 57 and 58 are disabled) and a value of 1 when the output of power converter 26 is single-ended (e.g., one of switches 57 and 58 is enabled).

In these and other embodiments, converter controller 24 may also control a duration of at least two of the phases based on an input signal (e.g., input signal INPUT to loop filter 22 or the controller input signal to converter controller 24), output voltage $V_{OUT}$, and/or another signal indicative of a desired voltage for output voltage $V_{OUT}$. For example, in some embodiments, duration $T_1$ of phase T1 may be determined by a peak current $I_{pk}$ for inductor current $I_L$, duration $T_2$ of phase T2 may be a fixed duration of time, and duration $T_3$ of phase T3 may be the remainder of time within a switching cycle of power converter 26 (e.g., $T_3=T_T-T_1-T_2$, where $T_T$ is a period of switching cycles of power converter 26). As another example, in other embodiments, duration $T_3$ of phase T3 may be determined by a peak current $I_{pk}$ for inductor current $I_L$, duration $T_2$ of phase T2 may be a fixed duration of time, and duration $T_1$ of phase T1 may be the remainder of time within a switching cycle of power converter 26 (e.g., $T_1=T_T-T_2-T_3$).

FIG. 10 illustrates a graph depicting current versus time for switching cycles of the power converter of FIG. 5 in tri-phase operation, in accordance with embodiments of the present disclosure. To determine peak current $I_{pk}$ in first triphase subrange A (e.g., $|V_{OUT}| < V_{SUPPLY}$), the following equations may be used:

$$\Delta_1 = \frac{V_{SUPPLY}T_1}{L}$$

$$\Delta_2 = \frac{(V_{SUPPLY} - V_{OUT})T_2}{2L}$$

$$\Delta_3 = \frac{V_{OUT}T_3}{L}$$

$$I_{pk} = \frac{I_{OUT}T_T + \frac{\Delta_2 T_2}{2} + \Delta_3 T_3}{T_2 + 2T_3}$$

$$I_{mid} = I_{pk} - \Delta_2$$

$$I_{min} = I_{pk} - \Delta_3$$

where $I_{min}$ is a minimum of inductor current $I_L$ during a switching cycle, $I_{mid}$ is inductor current $I_L$ at completion of phase T1 of a switching cycle, $I_{OUT}$ is a current flowing to a load between the output terminals of power converter 26, $\Delta_1$ is a magnitude of change in inductor current $I_L$ during phase T1, $\Delta_2$ is a magnitude of change in inductor current $I_L$ during phase T2, and $\Delta_3$ is a magnitude of change in inductor current $I_L$ during phase T3.

To determine peak current $I_{pk}$ in second triphase subrange B (e.g., $|V_{OUT}| \geq V_{SUPPLY}$), the following equations may be used:

$$\Delta_1 = \frac{V_{SUPPLY}T_1}{L}$$

$$\Delta_2 = \frac{(V_{SUPPLY} - V_{OUT})T_2}{L}$$

$$\Delta_3 = \frac{V_{OUT}T_3}{L}$$

$$I_{pk} = \frac{I_{OUT}T_T + \frac{\Delta_2 T_2 + \Delta_3 T_3}{2}}{T_2 + T_3}$$

$$I_{mid} = I_{pk} - \Delta_2$$

$$I_{min} = I_{pk} - \Delta_3$$

The foregoing equations may assume steady state conditions in which inductor current $I_L$ is the same at the end of a switching cycle as it is at the beginning of the switching cycle.

Accordingly, each switching cycle of power converter 26 may be evaluated as a series of events. In a first event, a switching configuration may be forced for a first phase having a forced duration. In some embodiments, such duration may be zero (such that a switching cycle operates in two phases). In a second event, a peak current may be detected in a second phase. In a third event, volt-second balancing may occur in a third phase until the next switching cycle.

By switching among at least three phases and controlling the order and durations of phases, power converter 26 may more effectively and reliably transition between a buck mode of operation when output voltage $V_{OUT}$ is less than supply voltage $V_{SUPPLY}$ and a boost mode of operation when output voltage $V_{OUT}$ is greater than supply voltage $V_{SUPPLY}$.

Also, by switching among at least three phases and controlling the order and durations of phases, converter controller 24 and power converter 26 may more effectively (as compared to traditional approaches) regulate common mode voltage of the output terminals of power converter 26, as each phase during operation in the differential mode couples an output terminal of power converter 26 to a power supply terminal via power inductor 62 or the other output terminal via power inductor 26.

Figure 11:
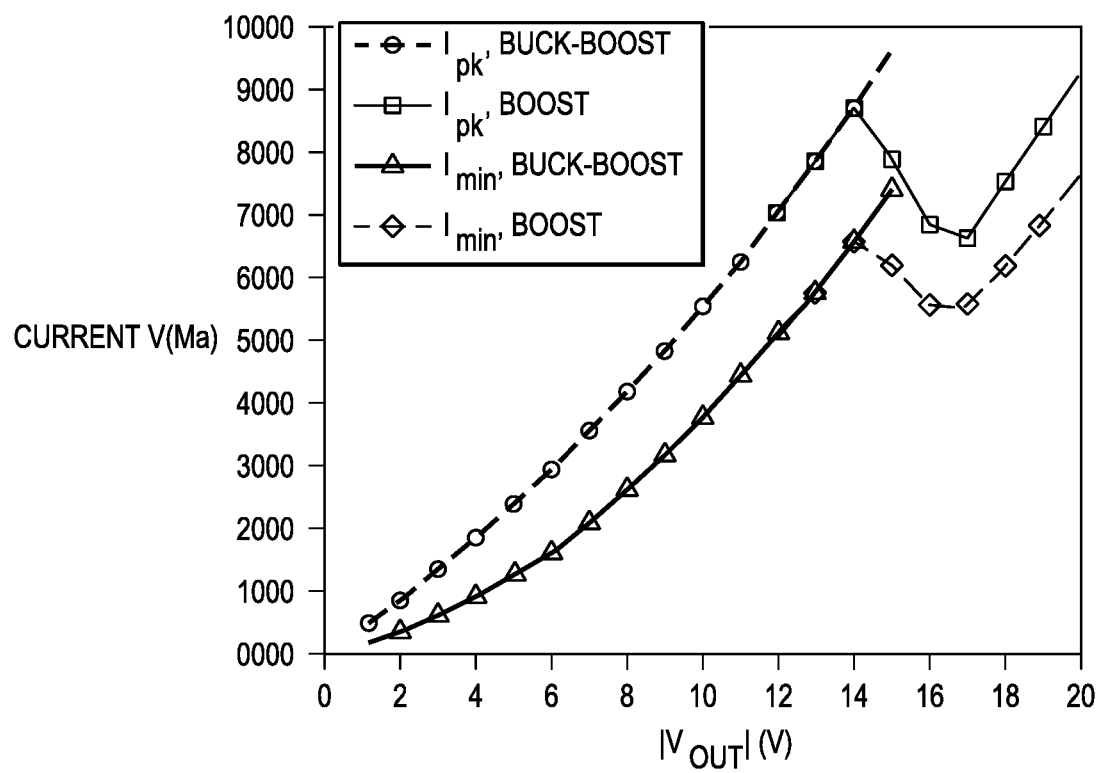
FIG. 11 illustrates a graph depicting example peak currents and minimum currents for an inductor current of a power inductor of the power converter of FIG. 5 as a function of magnitude of output voltage for operation in a buck-boost mode and a boost mode of the power converter, in accordance with embodiments of the present disclosure.

In addition, by switching among three phases and controlling the order and durations of phases, converter controller 24 and power converter 26 may permit maintenance of continuous peak current and/or continuous CCM current of power inductor 62 when switching between modes of operation (e.g., when switching between a buck or buck-boost mode for lower magnitudes of output voltage $V_{OUT}$ and a boost mode for higher magnitudes of $V_{OUT}$). For example, FIG. 11 illustrates a graph depicting example peak currents $I_{pk}$ and minimum currents $I_{min}$ for inductor current $I_L$ as a function of magnitude of output voltage $V_{OUT}$ for operation in a buck-boost mode and a boost mode of power converter 26, in accordance with embodiments of the present disclosure.

Furthermore, by switching among at least three phases and controlling the order and durations of phases, converter controller 24 and power converter 26 may operate more efficiently from a power consumption perspective (as compared to traditional approaches) due to the fact that the T1 and T2 phases couple an output terminal of power converter 26 to a power supply terminal via power inductor 62, reducing losses and reducing peak-to-peak currents (which in turn may reduce electromagnetic interference radiation).

Although the foregoing examples force a particular phase to have a fixed duration through switching cycles of a mode, in other embodiments of this disclosure, other phases may be forced to have a fixed duration through switching cycles of a mode. In some embodiments, the determination may be a qualitative determination. In other embodiments, such determination may be based on a time needed to measure peak current $I_{pk}$, a direct current inductor current $I_L$, and/or the mode of operation (e.g., buck, buck-boost, boost). Furthermore, the determination of the fixed amount of time for the phase forced to have the fixed-time duration may be based on variation in a common mode voltage of the output terminals of power converter 26, the mode of operation (e.g., buck, buck-boost, boost), and/or timings needed to provide for smooth transitions between modes of operation (e.g., buck, buck-boost, boost).

Figure 12A:
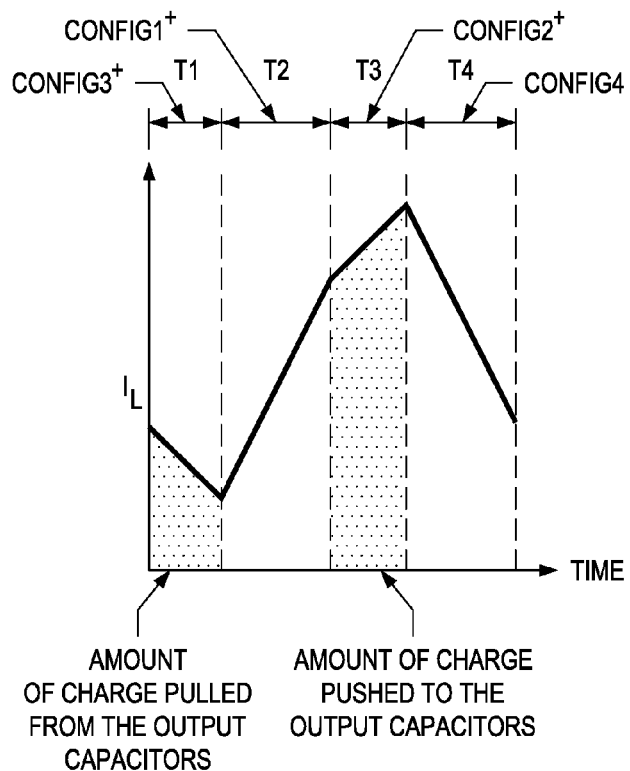
FIGS. 12A and 12B each illustrates a graphs respectively depicting an example waveforms of inductor current versus time for switching cycles of the power converter of FIG. 5 employing quadrature switching, in accordance with embodiments of the present disclosure.
Figure 12B:
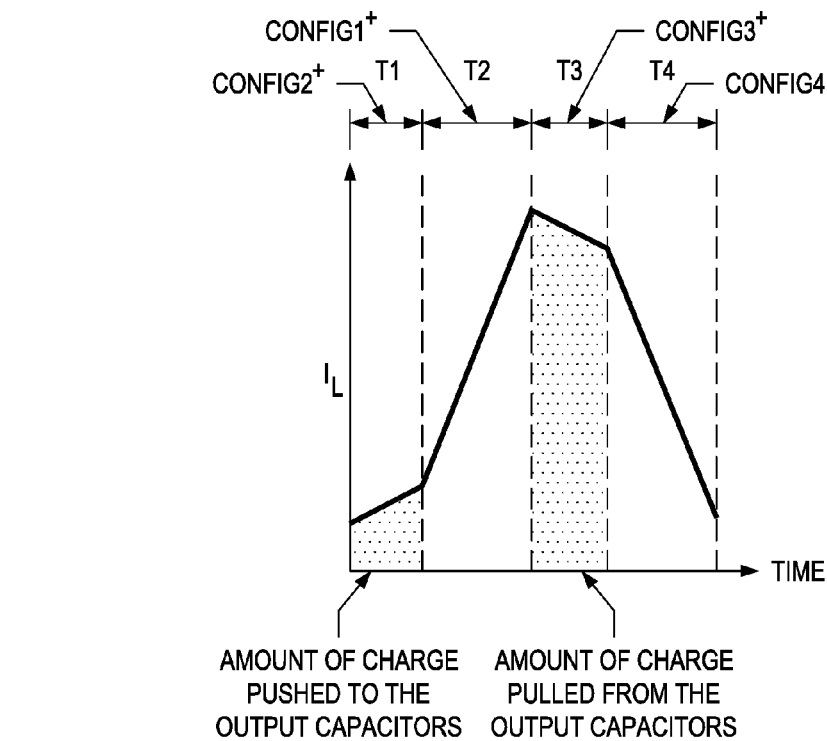

Although the foregoing discussion contemplates tri-phase switching per switching cycle of power converter 26, in some embodiments, converter controller 24 may in a differential output mode of power converter 26 (e.g., when switches 57 and 58 are disabled, for magnitudes of output voltage $V_{OUT}$ less than supply voltage $V_{SUPPLY}$), invoke quadrature switching of power converter 26 in order to control common mode voltage $V_{CM}$ of the output terminals of power converter 26. In quadrature switching, in addition to phases T1, T2, and T3 described above, a fourth phase T4 may be used and converter controller 24 may cause ordering of switch configurations during such phases based on whether to increase or decrease the common mode voltage $V_{CM}$ of the output terminals of power converter 26. For example, as shown in FIG. 12A, the order of CONFIG3+, CONFIG1+, CONFIG2+, and CONFIG4 may be used in phases T1, T2, T3, and T4 respectively to increase common mode voltage $V_{CM}$ over the switching cycle depicted in FIG. 12A, as more charge may be added to the output terminals during phase T3 than is removed from the output terminals during phase T1. Likewise, as shown in FIG. 12B, the order of CONFIG2+, CONFIG1+, CONFIG3+, and CONFIG4 may be used in phases T1, T2, T3, and T4 respectively to decrease common mode voltage $V_{CM}$ over the switching cycle depicted in FIG. 12B, as more charge may be removed from the output terminals during phase T3 than is added to the output terminals during phase T1. Thus, depending on which of configurations CONFIG2+ and CONFIG3+ is ordered first in a switching cycle, common mode voltage $V_{CM}$ may be increased or decreased, and the change in common mode voltage $V_{CM}$ may be controlled by controlling the durations of phases T1 and T3 employing CONFIG2$^+$ and CONFIG3$^+$.

In some embodiments, durations of phases T1 and T3 in quadrature switching may be fixed, which may lead to a hysteretic control for common mode voltage $V_{CM}$. In other embodiments, durations of phases T1 and T3 may be adaptively controlled, allowing for accurate control of common mode voltage $V_{CM}$. In other embodiments, the sum of durations of phases T1 and T3 may be fixed but may be varied relative to each other in order to control a level of charging and discharging of the output terminals to control common mode voltage $V_{CM}$.

Quadrature switching may have additional benefits over the tri-phase switching earlier discussed. First, quadrature switching may allow for smaller changes in common mode voltage $V_{CM}$ per switching cycle. Second, quadrature switching may reduce electromagnetic interference as its switching waveform is more sinusoidal than that of tri-phase switching and provides greater control of where common mode energy is placed. Third, lower peak currents may be needed for quadrature switching, thus improving power efficiency.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A switching power stage for producing an output voltage to a load, comprising:
    a configurable switched mode power converter, comprising:
        a power inductor;
        a plurality of switches arranged to sequentially operate in a plurality of switch configurations; and
        an output for producing the output voltage, the output comprising a first output terminal and a second output terminal; and
    a controller configured to, for at least one range of magnitudes of the output voltage:
        control the plurality of switches to operate in at least three switching phases per switching cycle of the configurable switched mode power converter in order to generate the output voltage, wherein switching cycles of the configurable switched mode power converter are substantially approximately equal in period; and
        control the plurality of switches to apply for each of the at least three switching phases a respective switch configuration of the plurality of switch configurations in order to achieve at least one of:
            maintenance of a continuous current of the power inductor throughout a dynamic range of the output voltage;
            maintenance of a continuous peak current of the power inductor throughout a dynamic range of the output voltage;
            regulation of a common mode voltage of the first output terminal and the second output terminal;
            minimization of electromagnetic interference of the power converter; and
            optimization of power efficiency of the power converter;
        wherein the controller is further configured to control durations of the at least three phases by applying a volt-second balance for each switching cycle.

2. The switching power stage of claim 1, wherein the plurality of switch configurations comprise:
    a first configuration wherein the plurality of switches are activated and deactivated such that the power inductor is coupled between a first input terminal of a power supply of the power converter and a second input terminal of the power supply;
    a second configuration wherein the plurality of switches are activated and deactivated such that the power inductor is coupled between the first input terminal and the first output terminal;
    a third configuration wherein the plurality of switches are activated and deactivated such that the power inductor is coupled between the first input terminal and the second output terminal;
    a fourth configuration wherein the plurality of switches are activated and deactivated such that the power inductor is coupled between the second input terminal and the first output terminal;
    a fifth configuration wherein the plurality of switches are activated and deactivated such that the power inductor is coupled between the second input terminal and the second output terminal; and
    a sixth configuration wherein the plurality of switches are activated and deactivated such that the power inductor is coupled between the first output terminal and the second output terminal.

3. The switching power stage of claim 2, wherein, in the first configuration, the power inductor is coupled to the first input terminal via a first terminal of the power inductor, and wherein the plurality of switch configurations comprise a seventh configuration wherein the plurality of switches are activated and deactivated such that the power inductor is coupled between the first input terminal and the second input terminal such that the power inductor is coupled to the first input terminal via a second terminal of the power inductor.

4. The switching power stage of claim 2, further comprising one or more additional configurations analogous to at least one of the first configuration, second configuration, third configuration, fourth configuration, fifth configuration, and sixth configuration in which the a polarity of the power inductor is reversed relative to that of the first configuration, second configuration, third configuration, fourth configuration, fifth configuration, and sixth configuration.

5. The switching power stage of claim 2, wherein for at least one of the at least one three phases, the configuration for such phase is selected based on a common mode voltage of the first output terminal and the second output terminal.

6. The switching power stage of claim 1, wherein the at least one range of magnitudes comprises a range of magnitudes greater than a first threshold voltage and magnitudes lesser than a second threshold voltage.

7. The switching power stage of claim 1, wherein the controller is further configured to control durations of at least one of the at least three phases based on at least one of:
 a peak current of one of the at least three phases and a duration of another of the at least three phases;
 duration of two of the at least three phases;
 peak currents of two of the at least three phases; and
 electrical charge transferred in two of the at least three phases.

8. The switching power stage of claim 6, wherein the controller is further configured to for magnitudes of the output voltage outside of the range of magnitudes, control the plurality of switches to operate in two switching phases per switching cycle of the configurable switched mode power converter.

9. The switching power stage of claim 6, wherein the range of magnitudes comprises:
 a first subrange for magnitudes of the output voltage lesser than a supply voltage of a power supply the power converter, wherein the controller is further configured to operate the power converter in a differential output mode; and
 a second subrange for magnitudes of the output voltage greater than the supply voltage, wherein the controller is further configured to operate the power converter in a single-ended output mode in which one of the first output terminal and one of the second output terminal is coupled to an input terminal of the power supply during all of the at least three phases.

10. A method for producing an output voltage to a load, comprising:
 in a configurable switched mode power converter, comprising a power inductor, a plurality of switches arranged to sequentially operate in a plurality of switch configurations, and an output for producing the output voltage, the output comprising a first output terminal and a second output terminal, for at least one range of magnitudes of the output voltage, controlling the plurality of switches to operate in at least three switching phases per switching cycle of the configurable switched mode power converter in order to generate the output voltage, wherein switching cycles of the configurable switched mode power converter are substantially approximately equal in period; and
 controlling the plurality of switches to apply for each of the at least three switching phases a respective switch configuration of the plurality of switch configurations in order to achieve at least one of:
  maintenance of a continuous current of the power inductor throughout a dynamic range of the output voltage;
  maintenance of a continuous peak current of the power inductor throughout a dynamic range of the output voltage;
  regulation of a common mode voltage of the first output terminal and the second output terminal;
  minimization of electromagnetic interference of the power converter; and
  optimization of power efficiency of the power converter; and
 controlling durations of the at least three phases by applying a volt-second balance for each switching cycle.

11. The method of claim 10, wherein the plurality of switch configurations comprise:
 a first configuration wherein the plurality of switches are activated and deactivated such that the power inductor is coupled between a first input terminal of a power supply of the power converter and a second input terminal of the power supply;
 a second configuration wherein the plurality of switches are activated and deactivated such that the power inductor is coupled between the first input terminal and the first output terminal;
 a third configuration wherein the plurality of switches are activated and deactivated such that the power inductor is coupled between the first input terminal and the second output terminal;
 a fourth configuration wherein the plurality of switches are activated and deactivated such that the power inductor is coupled between the second input terminal and the first output terminal;
 a fifth configuration wherein the plurality of switches are activated and deactivated such that the power inductor is coupled between the second input terminal and the second output terminal; and
 a sixth configuration wherein the plurality of switches are activated and deactivated such that the power inductor is coupled between the first output terminal and the second output terminal.

12. The method of claim 10, wherein the at least one range of magnitudes comprises a range of magnitudes greater than a first threshold voltage and magnitudes lesser than a second threshold voltage.

13. The method of claim 10, further comprising controlling durations of at least one of the at least three phases based on at least one of:
 a peak current of one of the at least three phases and a duration of another of the at least three phases;
 duration of two of the at least three phases;
 peak currents of two of the at least three phases; and
 electrical charge transferred in two of the at least three phases.

14. The method of claim 11, wherein, in the first configuration, the power inductor is coupled to the first input terminal via a first terminal of the power inductor, and wherein the plurality of switch configurations comprise a seventh configuration wherein the plurality of switches are activated and deactivated such that the power inductor is coupled between the first input terminal and the second input terminal such that the power inductor is coupled to the first input terminal via a second terminal of the power inductor.

15. The method of claim 11, further comprising one or more additional configurations analogous to at least one of the first configuration, second configuration, third configuration, fourth configuration, fifth configuration, and sixth configuration in which the a polarity of the power inductor is reversed relative to that of the first configuration, second configuration, third configuration, fourth configuration, fifth configuration, and sixth configuration.

16. The method of claim 11, wherein for at least one of the at least one three phases, the configuration for such phase is selected based on a common mode voltage of the first output terminal and the second output terminal.

17. The method of claim 12, further comprising for magnitudes of the output voltage outside of the range of magnitudes, controlling the plurality of switches to operate in two switching phases per switching cycle of the configurable switched mode power converter.

18. The method of claim 12, wherein the range of magnitudes comprises:
a first subrange for magnitudes of the output voltage lesser than a supply voltage of a power supply the power converter, wherein the controller is further configured to operate the power converter in a differential output mode; and
a second subrange for magnitudes of the output voltage greater than the supply voltage, wherein the controller is further configured to operate the power converter in a single-ended output mode in which one of the first output terminal and one of the second output terminal is coupled to an input terminal of the power supply during all of the at least three phases.

19. A switching power stage for producing an output voltage to a load, comprising:
a configurable switched mode power converter, comprising:
a power inductor;
a first supply terminal coupled to a first supply voltage;
a second supply terminal coupled to a second supply voltage;
an output for producing the output voltage, the output comprising a first output terminal and a second output terminal; and
a plurality of switches including switches for respectively coupling the power inductor to each of the first supply terminal, the second supply terminal, the first output terminal, and the second output terminal, such that the plurality of switches provides at least seven switching configurations of the plurality of switches among of the first supply terminal, the second supply terminal, the first output terminal, and the second output terminal; and
a controller configured to enable at least three switching configurations of the at least seven switching configurations per switching cycle of the configurable switched mode power converter, wherein switching cycles of the configurable switched mode power converter are substantially approximately equal in period.

20. The switching power stage of claim 19, wherein the controller is configured to enable three switching configurations of the at least seven switching configurations per switching cycle of the configurable switched mode power converter.

21. The switching power stage of claim 19, wherein one of the at least three switching configurations comprises the plurality of switches activated and deactivated such that the power inductor is coupled between the first supply terminal and the second supply terminal.

22. The switching power stage of claim 19, wherein one of the at least three switching configurations comprises the plurality of switches activated and deactivated such that one of the first supply terminal and the second supply terminal is coupled to one of the first output terminal and the second output terminal.

23. The switching power stage of claim 19, wherein one of the at least three switching configurations comprises the plurality of switches activated and deactivated such that the power inductor is coupled between the first output terminal and the second output terminal.

24. The switching power stage of claim 19, wherein the at least three switching configurations comprise four switching configurations.

25. The switching power stage of claim 24, wherein the four switching configurations comprise:
a first switching configuration wherein the plurality of switches are activated and deactivated such that the power inductor is coupled between the first supply terminal and the second supply terminal;
a second switching configuration wherein the plurality of switches are activated and deactivated such that the power inductor is coupled between the second supply terminal and the second output terminal;
a third switching configuration wherein the plurality of switches are activated and deactivated such that the power inductor is coupled between the first output terminal and the second output terminal; and
a fourth switching configuration wherein the plurality of switches are activated and deactivated such that the power inductor is coupled between the first supply terminal and the first output terminal.

26. The switching power stage of claim 25, wherein the controller is configured to enable only three of the first switching configuration, the second switching configuration, the third switching configuration, and the fourth switching configuration during a switching cycle of the configurable switched mode power converter.

27. The switching power stage of claim 25, wherein the controller is configured to enable all four of the first switching configuration, the second switching configuration, the third switching configuration, and the fourth switching configuration during a switching cycle of the configurable switched mode power converter.

28. A method for producing an output voltage to a load, comprising, in a configurable switched mode power converter, comprising a power inductor, a first supply terminal coupled to a first supply voltage, a second supply terminal coupled to a second supply voltage, an output for producing the output voltage, the output comprising a first output terminal and a second output terminal, and a plurality of switches including switches for respectively coupling the power inductor to each of the first supply terminal, the second supply terminal, the first output terminal, and the second output terminal, such that the plurality of switches provides at least seven switching configurations of the plurality of switches among of the first supply terminal, the second supply terminal, the first output terminal, and the second output terminal:
enabling at least three switching configurations of the at least seven switching configurations per switching cycle of the configurable switched mode power converter, wherein switching cycles of the configurable switched mode power converter are substantially approximately equal in period.

29. The method of claim 28, further comprising enabling three switching configurations of the at least seven switching configurations per switching cycle of the configurable switched mode power converter.

30. The method of claim 28, wherein one of the at least three switching configurations comprises the plurality of switches activated and deactivated such that the power inductor is coupled between the first supply terminal and the second supply terminal.

31. The method of claim 28, wherein one of the at least three switching configurations comprises the plurality of switches activated and deactivated such that one of the first supply terminal and the second supply terminal is coupled to one of the first output terminal and the second output terminal.

32. The method of claim 28, wherein one of the at least three switching configurations comprises the plurality of switches activated and deactivated such that the power inductor is coupled between the first output terminal and the second output terminal.

33. The method of claim 28, wherein the at least three switching configurations comprise four switching configurations.

34. The method of claim 33, wherein the four switching configurations comprise:
   a first switching configuration wherein the plurality of switches are activated and deactivated such that the power inductor is coupled between the first supply terminal and the second supply terminal;
   a second switching configuration wherein the plurality of switches are activated and deactivated such that the power inductor is coupled between the second supply terminal and the second output terminal;
   a third switching configuration wherein the plurality of switches are activated and deactivated such that the power inductor is coupled between the first output terminal and the second output terminal; and
   a fourth switching configuration wherein the plurality of switches are activated and deactivated such that the power inductor is coupled between the first supply terminal and the first output terminal.

35. The method of claim 34, further comprising enabling only three of the first switching configuration, the second switching configuration, the third switching configuration, and the fourth switching configuration during a switching cycle of the configurable switched mode power converter.

36. The method of claim 34, further comprising enabling all four of the first switching configuration, the second switching configuration, the third switching configuration, and the fourth switching configuration during a switching cycle of the configurable switched mode power converter.

* * * * *